United States Patent [19]

Hidada et al.

[11] Patent Number: 4,881,116

[45] Date of Patent: Nov. 14, 1989

[54] PACKAGE FOR INTEGRATED CIRCUIT

[75] Inventors: Norio Hidada, Kanagawa; Yasutake Hirachi, Tokyo, both of Japan

[73] Assignee: Fujitsu Limited, Kawasaki, Japan

[21] Appl. No.: 346,243

[22] Filed: May 2, 1989

Related U.S. Application Data

[63] Continuation of Ser. No. 56,709, Jun. 2, 1987, abandoned.

[30] Foreign Application Priority Data

Jun. 2, 1986 [JP] Japan ............................. 61-127739
May 25, 1987 [JP] Japan ............................. 62-125733

[51] Int. Cl.⁴ ..................... H01L 23/30; H01L 23/14; H01L 23/48
[52] U.S. Cl. ............................................. 357/74; 357/80
[58] Field of Search .................. 357/80, 71, 74, 70, 357/84; 174/68.5

[56] References Cited

U.S. PATENT DOCUMENTS

| | | | |
|---|---|---|---|
| 4,262,189 | 12/1986 | Yamamoto et al. | 357/71 |
| 4,498,122 | 2/1985 | Rainal | 174/68.5 |
| 4,551,746 | 11/1985 | Gilbert et al. | 357/74 |
| 4,560,962 | 12/1985 | Barrow | 174/68.5 |
| 4,673,904 | 6/1987 | Landis | 174/68.5 |

FOREIGN PATENT DOCUMENTS

| | | | |
|---|---|---|---|
| 0070656 | 6/1981 | Japan | 357/84 |
| 0054661 | 3/1983 | Japan | 357/84 |
| 58-190046 | 5/1983 | Japan | |
| 0212045 | 9/1986 | Japan | 357/87 |

OTHER PUBLICATIONS

176 Microwave Journal, 27, Mar. 1984, No. 3, Dedham, Mass., U.S.A., "New Surface-Mounted Package Breaks from Traditional MIC Packaging", Boo et al.

International Publication No. WO 84/01470, PCT/US83/01516, "Leadless Chip Carrier for Logic Components".

"Surface-Mounted Gas Active Splitter and Attenuator MMIC's Used in a 1-10-GHz Leveling Loop", G. S. Barta et al., IEEE Transactions on Microwave Theory and Techniques, Vo. MTT-34, No. 12, Dec. 1986, pp. 1569-1575.

"Surface-Mount Pack Houses GaAs MMICs", Geoffrey Herrick et al., Microwaves & RF, Jun. 1986, pp. 157-169.

*Primary Examiner*—Rolf Hille
*Assistant Examiner*—S. V. Clark
*Attorney, Agent, or Firm*—Staas & Halsey

[57] ABSTRACT

A package for an integrated circuit having conductor patterns which can be connected to an external circuit to connect the integrated circuit to the external circuit. The package includes a dielectric plate which is provided on one end face with a grounding conductor. The conductor patterns are provided on the opposite end face of the dielectric plate. The dielectric plate is provided with conductor poles which are located between the conductor patterns and which extend through the thickness of the dielectric plate to be connected to the grounding conductor.

24 Claims, 10 Drawing Sheets

PACKAGE FOR INTEGRATED CIRCUIT

This is a continuation of co-pending application Ser. No. 056,709 filed on June 2, 1987 now abandoned.

BACKGROUND OF THE INVENTION

1. Field of the Invention

The present invention relates to an integrated circuit (IC). More precisely, it relates to a package for an ultra high speed IC.

2. Description of the Related Art

FIGS. 12 and 13 show a known IC package, wherein FIG. 12 is a perspective view of a known IC package and FIG. 13 is a cross sectional view taken along the line X—X' in FIG. 12. In FIGS. 12 and 13, an integrated circuit (or IC chip) 1 is incorporated in the package and is electrically connected to an external circuit 3 through an external connecting terminal portion 2. The connecting terminal portion 2 has a dielectric alumina frame 5 secured to a metal substrate 4 made of copper or the like, and connecting conductor patterns 6a, 6b, and 6c provided on the alumina frame 5. An alumina frame 8 having a sealing conductor ring 7 coated on the rear face (upper face in FIG. 13) thereof, is placed on the conductor patterns 6b. The conductor patterns 6b are formed by coating the alumina frame 5 with a tungsten paste. The conductor patterns 6b are plated with Nickel (Ni) and gold (Au) and form conductor patterns 6b, 6a and 6c in contact with the bottom face (FIG. 13) and on opposite sides of the alumina frame 8, respectively. The outer conductor patterns 6c are connected to the leads 9, which are connected to the external circuit 3. The inner conductor patterns 6a are connected to the IC 1 by means of lead wires 61.

The conductor ring 7 is formed by metallizing the upper surface of the alumina frame 8 and then plating it with Ni and Au, similar to the conductor patterns 6b. Accordingly, the conductor patterns 6b form a laminate structure together with the alumina frames 5 and 8.

FIG. 14 is a longitudinal sectional view of an IC package shown in FIG. 12, showing a parallel arrangement of the conductor patterns 6 when located side by side.

In the IC package having the external connecting terminal portion of the prior art shown in FIGS. 12-14, the connecting conductor patterns 6b and the sealing conductor pattern 7 are electromagnetically connected through the alumina (alumina frame 8) having a relative dielectric constant of 9.6, thus resulting in the occurrence of a resonance phenomenon. This is equivalent to an establishment of a connection between a line 9' of the conductor patterns 6b having a characteristic impedance $Z_0$ and a ring resonant line 10 corresponding to the length of the conductor ring 7, so that the line 9' has a characteristic impedance different from $Z_0$ in a certain frequency band, as shown in FIG. 15. As a result, signals input to the leads 9 from a signal source (not shown) having an impedance $Z_0$ are reflected by the conductor pattern 6b, because of impedance irregularities. The reflected signals will cause a misoperation of the IC, particularly an ultra high speed IC.

In addition to the misoperation mentioned above, the side-by-side arrangement of the conductor patterns 6, as mentioned above causes the conductor patterns to be electromagnetically connected through the alumina (alumina frames 5 and 8), resulting in an undesirable cross talk, which can be considered electromagnetic interference.

The higher the frequency component of the high speed pulse signals, the larger the possibility of the occurrence of cross talk.

To solve the problems mentioned above, Japanese Unexamined Patent Publication (Kokai) No. 58-190046 teaches a modified arrangement as shown in FIG. 16, in which a metal housing 40 has through openings 40A in which corresponding connecting terminal units 31 are fitted. Each of the terminal units 31 has a dielectric substrate 29 which is provided, on its outer surface, with a laminated strip line 30 and a dielectric block 33 which is integral with the dielectric substrate 29 and which is placed on the strip line 30. Leads 9 are connected to the strip lines 30.

FIG. 17 shows steps for manufacturing the terminal units 31 of the arrangement shown in FIG. 16, in which a predetermined pattern of tungsten paste (corresponding to the strip 30) is formed on an alumina raw ceramic plate (corresponding to the substrate 29), as can be seen in FIG. 17(a). Subsequently, a smaller alumina raw ceramic plate (corresponding to the dielectric block 33) is located on the substrate 29, as shown in FIG. 17(b), and the assembly is then sintered. Then, as can be seen from FIG. 17(c), the pattern 30 is plated with Au, and the bottom and sides of the assembly (terminal unit 31) and the upper face of the smaller ceramic plate (dielectric block 33) are metallized.

With this arrangement, the strip 30 is split into two portions by the dielectric block 31, one of which portions is connected to an external circuit of the package through the lead 9 and the other strip portion (inner strip portion) being connected to an internal circuit (IC, etc.) of the package.

However, in the package shown in FIGS. 16 and 17, although the strip portions 30 are shielded by the metal housing, it is difficult to manufacture the electrical terminal units 31 in the manner shown in FIG. 17. This difficulty becomes greater in particular in the case of an IC package having a large number of terminals. Furthermore, it is impossible to prevent cross talk between the portions of the strips 30 located outside of the metal housing.

To solve this problem, there is also known an IC package as shown in FIG. 18. In FIG. 18, 40 designates the metal housing, 40A the through openings, 22 a cap, 9 the leads connected to the strips 30, and 29 the dielectric substrates of the terminal units 31. In the IC package shown in FIG. 18, metallized layers 25 are formed on the dielectric substrate 29, between the adjacent leads 9 to prevent cross talk between the terminals 9 (strip portions 30). However, in the arrangement shown in FIG. 18, it is difficult to form the metallized layers 25, and this arrangement is not suitable for the provision of the terminals at a high density. Also, since the metallized layers 25 are formed only on the surface of the dielectric substrate 29, an electromagnetic coupling can be produced through an inner portion of the dielectric substrate.

Furthermore, in the prior art, usually the leads 9 can be connected to the conductor patterns 6c by brazing or soldering, as shown at 100 in FIG. 12. However, in this soldering or brazing, no attention has been paid to the impedance irregularity mentioned above. Namely, the soldering or brazing materials 100 irregularly spread out of the leads 9 at the connections between the leads 9 and the conductor patterns 6c, and this has an adverse influence on the impedance regularity of the IC package.

SUMMARY OF THE INVENTION

The primary object of the present invention is to eliminate the drawbacks mentioned above, i.e. to eliminate a resonance by the conductor patterns and the conductor ring, to prevent an electromagnetic connection between the conductor patterns, and to realize a characteristic impedance substantially identical to a characteristic impedance of the signal source, thereby decreasing the reflection of the signals and the cross talk.

Another object of the present invention is to provide a simple IC package which can be easily manufactured.

Still another object of the present invention is to provide an IC package having an improved impedance regularity.

In order to achieve the above objects, according to the present invention, there is provided a package for an IC having conductor patterns which can be connected to an external circuit to connect the integrated circuit to the external circuit, comprising a dielectric plate which is provided, on one end face with a grounding conductor and on an opposite end face with said conductor patterns, said first dielectric plate being provided with conductor poles which are located between the conductor patterns and which extend through the thickness of the dielectric plate to be connected to the grounding conductor.

According to another aspect of the present invention, there is provided an IC package having conductor patterns which can be connected to an external circuit to connect the integrated circuit to the external circuit, comprising:

a first dielectric plate which is provided, on one end face with a grounding conductor and on an opposite end face with said conductor patterns, said first dielectric plate being provided with conductor poles which are located between the conductor patterns and which extend through the thickness of the dielectric plate to be connected to the grounding conductor, and a second dielectric plate which is located on the conductor patterns of the first dielectric plate and which is provided with conductor poles which are electrically connected at least partially to the conductor poles of the first dielectric plate.

According to still another aspect of the invention, there is provided an IC package having conductor patterns which can be connected to an external circuit to connect the integrated circuit to the external circuit, comprising:

a first dielectric plate which is provided, on one end face with a grounding conductor and on an opposite end face with said conductor patterns, said first dielectric plate being provided with conductor poles which are located between the conductor patterns and which extend through the thickness of the dielectric plate to be connected to the grounding conductor; and a second dielectric plate which is located on the conductor patterns of the first dielectric plate and which is provided, on an end face far from the first dielectric plate, with a conductive film, said second dielectric plate being provided with conductor poles which are connected to the conductive film and which are electrically connected at least partially to the conductor poles of the first dielectric plate.

With these arrangements, since the grounded conductor poles are provided in the conductive film (sealing conductor ring) of the second dielectric plate so that the sealing conductor ring is grounded, the equivalent length of the ring 10 shown in FIG. 15 can be reduced, resulting in a very high resonant frequency, and as a result of this very high resonant frequency, no resonance occurs in a desired frequency band of the integrated circuit and no substantial change in the characteristic impedance at the resonant frequency occurs. Accordingly, it is possible to make the impedance of the external terminal portion as close as possible to the characteristic impedance of the signal source by properly dimensioning the external terminal portions throughout the desired frequency band of the IC, in order to prevent the reflection of the signals.

The provision of the grounded conductor poles between the conductor patterns of the first dielectric plate contributes to the prevention of cross talk.

BRIEF DESCRIPTION OF THE DRAWINGS

The invention will be described below in detail with reference to the accompanying drawings, in which.

DESCRIPTION OF THE PREFERRED EMBODIMENTS

Figure 1:
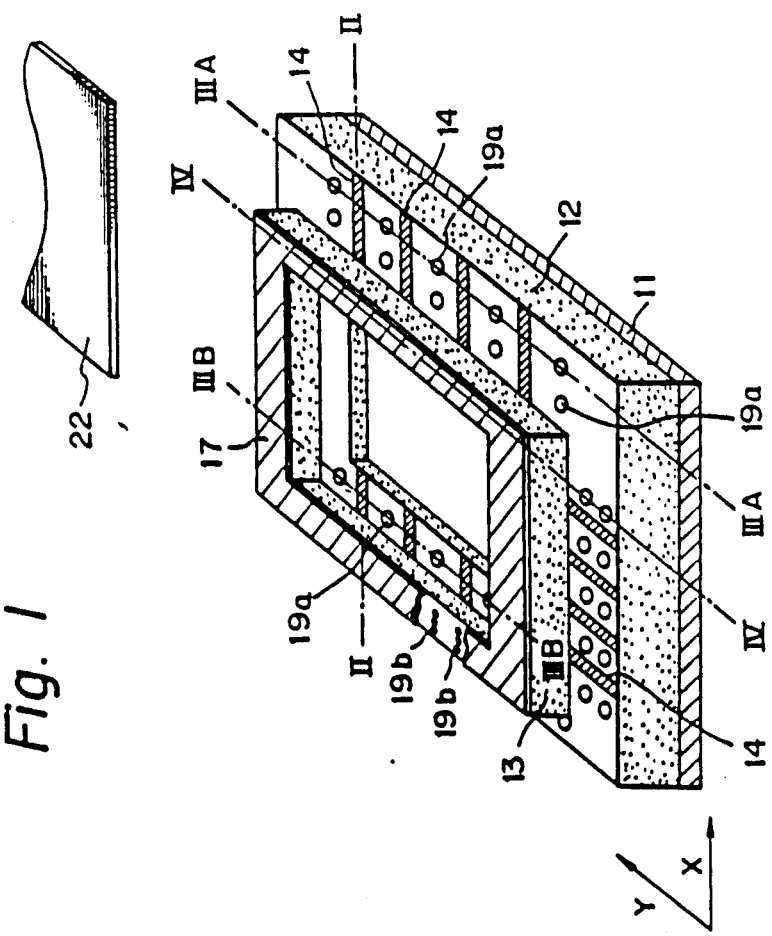
FIG. 1 is a partially broken perspective view of an IC package according to an embodiment of the present invention.

FIG. 1 shows a first embodiment of the IC package according to the present invention, in which the package has a grounding metal base, such as a copper block 11 which is adapted to carry an IC (or ICs), not shown in FIG. 1 for clarification of the drawing, thereon and to provide a grounding conductor. A hollow rectangular first alumina frame (first dielectric plate) 12 is secured to the copper block 11 and is provided, on four upper side faces thereof, with sixteen bar-like external terminals 14, four for each upper side face of the frame 12. To the upper faces of the terminals 14 is secured a hollow rectangular second alumina frame (second dielectric plate) 13 having a conductive film 17 thereon, which is made molten by heating to adhere an air sealing conductive cap 22 located thereon to the conductive film 17.

Figure 2:
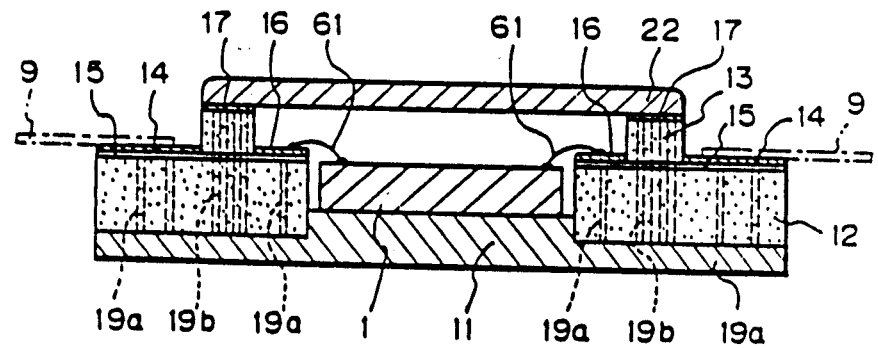
FIG. 2 is a sectional view taken along the line II—II in FIG. 1.

FIG. 2 shows a cross sectional view taken along the line II—II in FIG. 1. In FIG. 2, the external terminal portion has bar-like connecting conductor patterns (power lines and signal lines) 14, 15, and 16 which are provided on the first dielectric alumina frame 12 secured to the grounding conductor plate (base) 11.

Figure 13:
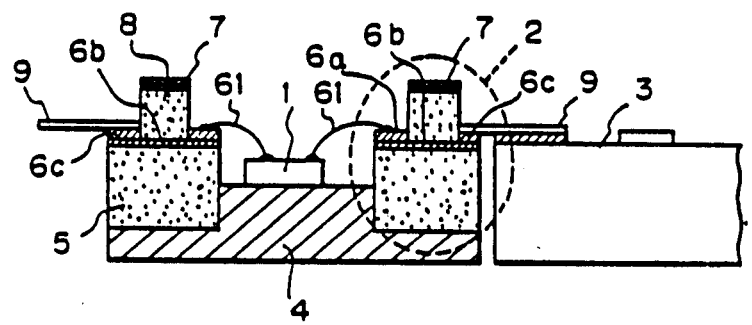
FIG. 13 is a sectional view taken along the line X—X' in FIG. 12.
Figure 14:
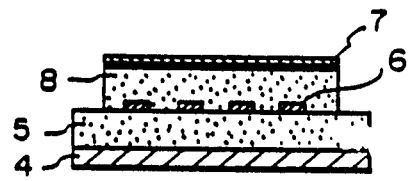
FIG. 14 is a sectional view taken along the line Y—Y' in FIG. 12.

The conductor patterns 14, 15, and 16 correspond to the conductor patterns 6c, 6b, and 6a in FIG. 13, respectively and can be made by the same process as used to form the conductor patterns 6c, 6b, and 6a. Namely, the conductor patterns 15 are made of tungsten paste and the conductor patterns 14 and 16 are made of Ni—Au or Au plate provided on the tungsten paste conductor patterns 15.

The IC or IC chip 1 located on the base 11 can be connected to the inner conductor patterns 16 which are located inside the IC package by lead wires 61 which can be made of, for example, Koval, marketed by the Westinghouse Electric Corp. USA, and plated with gold.

Figure 3A:
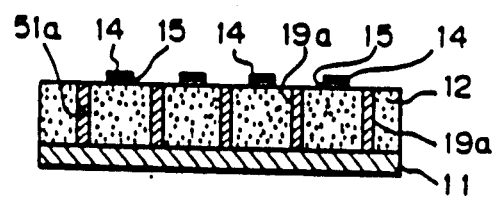
FIGS. 3A and 3B are sectional views taken along the lines IIIA—IIIA and IIIB—IIIB, in FIG. 1 respectively.
Figure 3B:
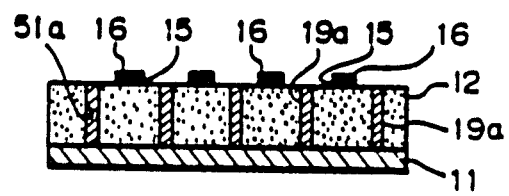

FIGS. 3A and 3B are sectional views taken along the lines IIIA—IIIA and IIIB—IIIB in FIG. 1. As can be understood from FIGS. 3A and 3B, on the opposite sides of the adjacent conductor patterns 14 and 16 are provided circular through holes 51a in which conductor poles 19a extend, respectively.

In the illustrated embodiment, two pairs of conductor poles 19a are located on opposite sides of each conductor pattern 14 and one pair of conductor poles 19a is located on opposite sides of each conductor pattern 16. However, the number of the conductor poles 19a is not limited to those in the illustrated embodiment. In addition, it is not always necessary to regularly arrange the conductor poles 19a on either side of the conductor patterns 14 and 16.

Figure 9:
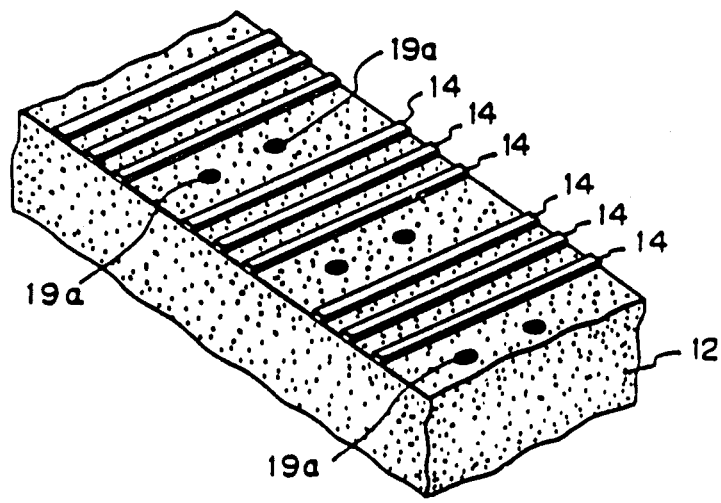
FIG. 9 is a perspective view of an example of an arrangement of holes which are filled with conductors, between conductor patterns.

FIG. 9 shows a variant of an arrangement of the conductor poles 19a which are located at every three conductor patterns 14. Namely, two conductor poles 19a are located between conductor pattern groups each having three conductor patterns 14.

In the arrangement shown in FIG. 9, it is assumed that cross talk between the conductor patterns 14 in the same conductor pattern group is not relatively serious.

The holes 51a extend through the first alumina frame 12.

Figure 4:
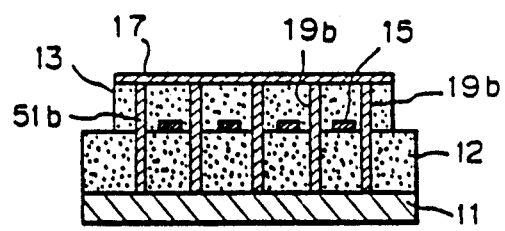
FIG. 4 is a sectional view taken along the line IV—IV in FIG. 1.

On the other hand, as can be seen from FIG. 4, which is a sectional view taken along the line IV—IV in FIG. 1, circular through holes 51b in which conductor poles 19b are buried are provided in the alumina frame 12 on the opposite sides of the adjacent conductor patterns 15.

The second alumina frame 13, which has a rear face (upper end face) covered with the sealing ring 17, is located on the conductor patterns 15, as can be seen from FIG. 2. In FIG. 4, the holes 51b extend through the first and second alumina frames 12 and 13 and are located under the sealing ring 17.

In an example, the diameter of the conductor poles 19a and 19b is about 0.1-0.5 mm, the width of the conductor patterns 14, 15, and 16 is about 0.2-0.5 mm, and the thickness, the width in the X-direction (FIG. 1) and the width in the Y-direction (FIG. 1), of the alumina frames 14, 15, and 16 are 0.2-0.4 mm, 6-20 mm, and 8-20 mm, respectively.

With the aforementioned construction, according to the present invention, the conductor patterns 14 and 16 (on which the alumina frame 13 does not lie) consist of lines having a center conductor formed by the conductor patterns 14 and 16, and a grounding conductor formed by the copper block 11 and the conductor poles 19a connected to the copper block 11, so that almost all of the electromagnetic field terminates at the copper block 11 and the conductor poles 19a. As a result, the electromagnetic interference between the adjacent conductor patterns 14, 16 is reduced, realizing a decrease in cross talk. In addition to the foregoing, the characteristic impedance $Z_0$ of the line can be optionally selected by adjusting the distance between the conductor patterns 14, 16 and the copper block 11 and between the conductor patterns 14, 16 and the conductor poles 19a. This makes it possible to establish a line having an impedance substantially identical to an impedance of the signal source, resulting in a prevention of the reflection of the signals due to the impedance irregularities.

With respect to the arrangement of the conductor patterns 15, this consists of a line having a center conductor formed by the conductor patterns 15, and a grounding conductor surrounding the center conductor, formed by the copper block 11, the conductor poles 19b connected to the copper block 11 and the sealing ring 17 connected to the conductor poles 19b, so that almost all of the electromagnetic field terminates at the grounding conductor. Namely, the copper block 11, the conductors 19b, and the sealing ring 17 serve as an electromagnetic shield to prevent the electromagnetic field from leaking outside the package. As a result, no electromagnetic interference occurs between the conductor patterns, thus preventing cross talk. The characteristic impedance $Z_0$ of the line can be optionally selected by adjusting the distance between the copper block 11 and the conductor poles 19a and between the sealing ring 17 and the conductor poles 19a. This makes it possible to establish a line having an impedance substantially identical to the impedance of the signal source, resulting in the prevention of the reflection of the signals due to impedance irregularities.

Figure 15:
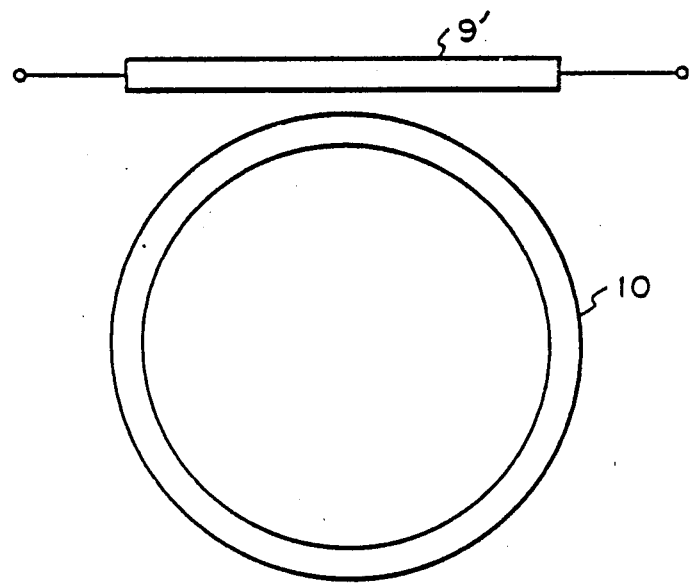
FIG. 15 is a schematic view of an equivalent circuit of the IC package shown in FIG. 12.
Figure 16:
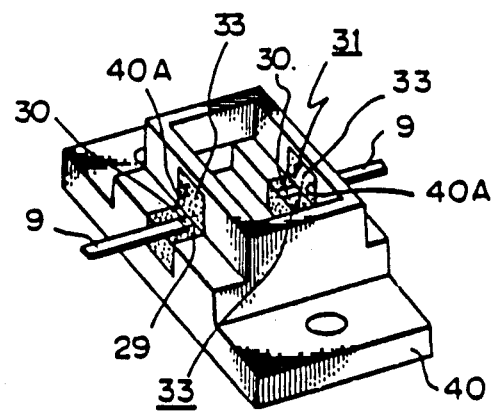
FIG. 16 is a perspective view of another known IC package.
Figure 17A:
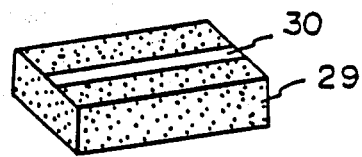
FIG. 17A–17C are a view showing steps for manufacturing a known IC package; and, FIG. 18 is a perspective view of still another known IC package.
Figure 17B:
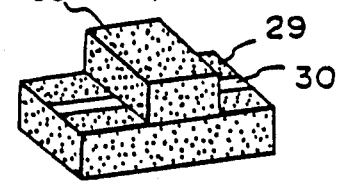
Figure 17C:
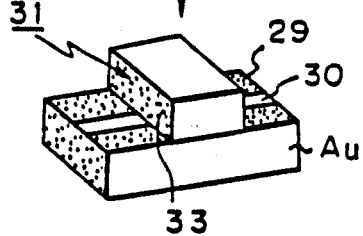
Figure 18:
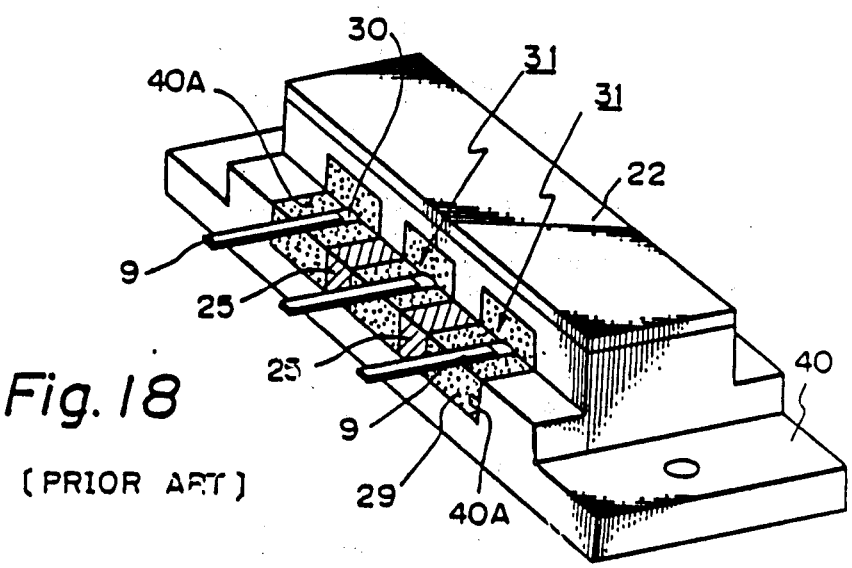

Since the sealing conductor ring 17 is connected to the conductor poles 19b at a plurality of contact portions, namely, since the sealing conductor ring 17 is grounded at a plurality of points through the conductor poles 19b, the equivalent length of the ring 10 shown in FIG. 15 can be decreased, so that the resonance frequency can be increased. This prevents the occurrence of resonance at a desired frequency band of the IC and prevents a change in the characteristic impedance of the conductor patterns of the external terminal portion, due to a ring resonance at a specific frequency band.

The IC package of the invention is manufactured as follows.

To make the conductor poles 19a and 19b, raw ceramic plates in the form of a green sheet prior to sintering alumina thereto are pierced to form the through holes 51a and 51b by, for example, drilling, and then tungsten paste is filled into the through holes thus formed by, for example, a roller. The conductor patterns 14, 15 and 16 can be made at the same time as the preparation of the conductor poles 19a and 19b, by, for example, using a predetermined shape of a mask screen.

Figure 5:
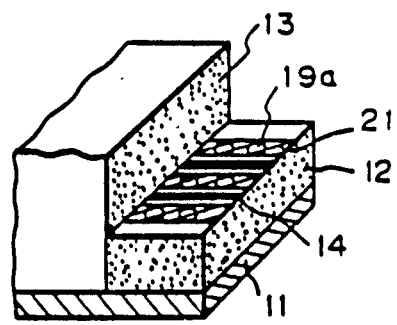
FIG. 5 is a perspective view of another embodiment of an IC package according to the present invention.

The conductor poles 19b of the upper alumina frame 13 which is located on the lower alumina frame 12 can be formed by burying tungsten paste in the through holes 51b which are formed by drilling to extend through the first and second alumina frames 12 and 13. Alternatively, it is possible to separately form the through holes 51b in the alumina frames 12 and 13 and to bury tungsten paste in the respective through holes 51b. Then, the alumina frame 13 is positioned on the alumina frame 12 with a high accuracy, so that the conductor poles 19b formed in the through holes 51b of the alumina frame 12 can be electrically connected to the corresponding conductor poles 19b formed in the through holes 51b of the alumina frame 12. In this embodiment, it is preferable to provide additional conductor patterns 21 which electrically connect the same rows of conductor poles 19a on the opposite sides of the conductor patterns 14, as shown in FIG. 5.

The additional conductor patterns 21 effectively absorb a possible positional deviation between the conductor poles 19b in the alumina frames 12 and 13 when the alumina frames are placed one on the other.

The additional conductor patterns 21 also contribute to a further decrease in the electromagnetic interference between the adjacent conductor patterns 14.

Figure 6:
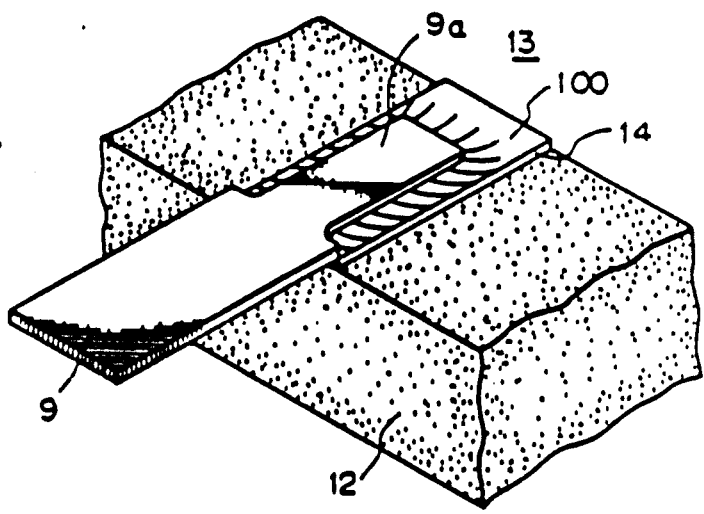
FIG. 6 is an enlarged perspective view of a lead which is connected by brazing to a conductor pattern provided on an alumina substrate.

To decrease the impedance irregularities, according to the present invention, the leads (terminals) 9 for electrically connecting the IC 1 to the external circuit 3 (FIG. 13) are brazed or soldered to the corresponding conductor patterns 14 by, for example, silver solder 100, taking the solder areas into consideration, as shown in FIG. 6. Namely, as mentioned before, in the prior art, no attention has been paid to the solder areas which present an irregular appearance, resulting in an increase of the impedance irregularities.

As can be seen from FIG. 6, according to the present invention, each of the leads 9 has a narrower end 9a which is brazed or soldered to the corresponding conductor pattern 14 through silver solder 100, which has a width substantially identical to the width of the lead 9. Namely, the solder 100 constitutes a precise extension of the lead 9 so as to provide a good impedance matching.

Figure 7:
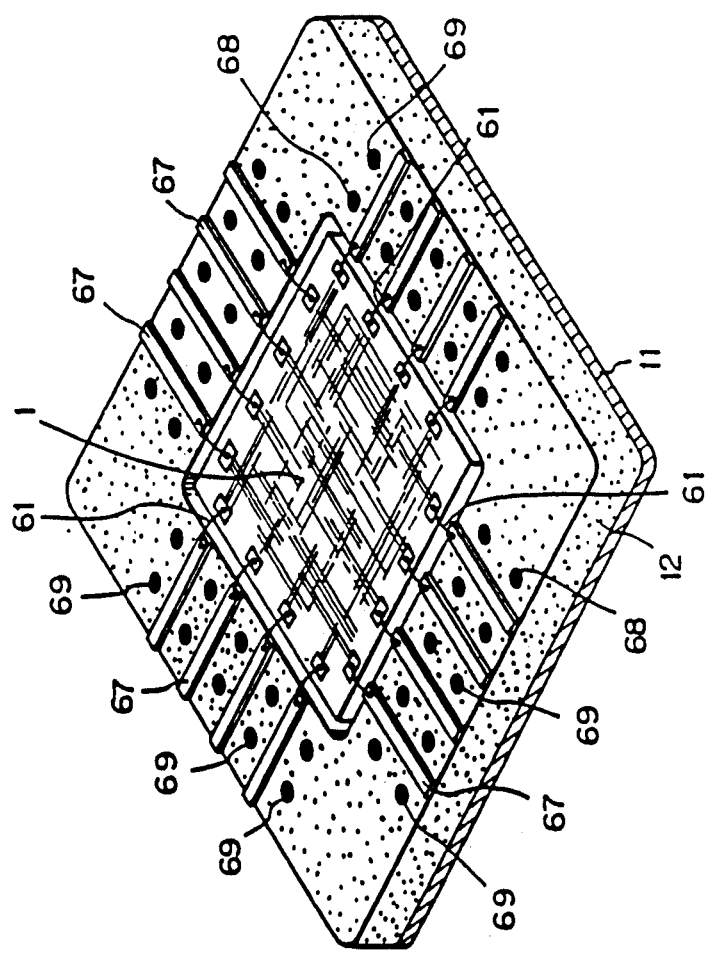
FIG. 7 is an enlarged perspective view of an IC package not having a second alumina substrate, according to another embodiment of the present invention.
Figure 8:
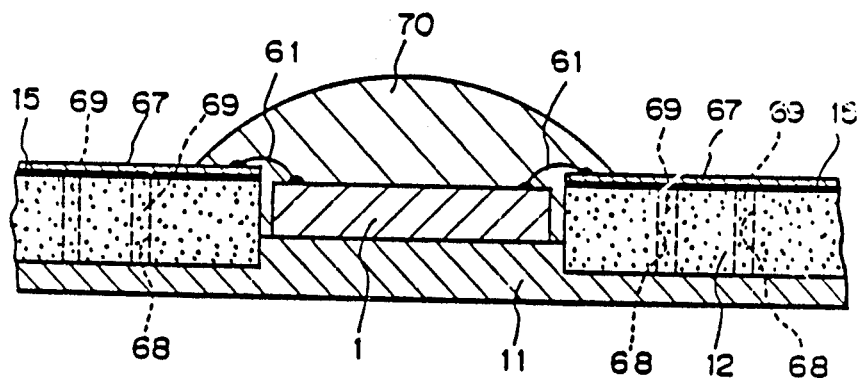
FIG. 8 is a sectional view of a part of an IC package shown in FIG. 7 and showing an IC which is directly enclosed in a plastic mold.

FIGS. 7 and 8 show a modified embodiment of the present invention. In FIG. 7, the second alumina frame 13 (FIG. 1) is omitted. Namely, in the embodiment shown in FIGS. 7 and 8, the IC (chip) 1 is directly enclosed by a resin mold 70. The IC 1 is located on the metal base 11 made of copper or the like and is connected by the lead wires 61, to the conductor pattern 67 which is made of, for example, Au plate, provided on the tungsten paste conductor patterns 15 which are, in turn, provided on the first alumina frame 12. Also, in this embodiment, the conductor poles 69 are buried in the corresponding through holes 68 provided between the conductor patterns 67.

Alternatively, if the IC package shown in FIG. 7 is mounted in another large package or housing (not shown), it is not necessary to enclose the IC package with the resin mold 70.

Figure 10A:
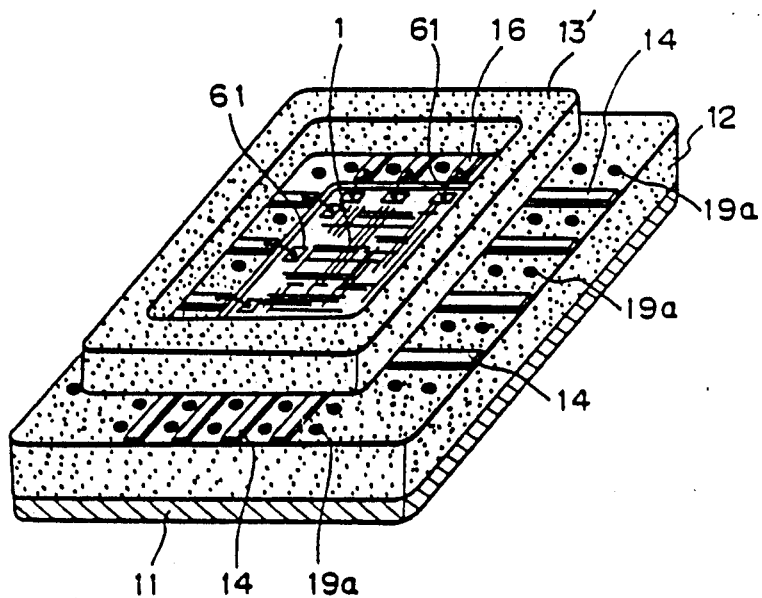
FIG. 10A is a perspective view of an IC package according to another embodiment of the present invention in which the second alumina frame is used as a spacer and has no conductor pattern thereon.
Figure 10B:
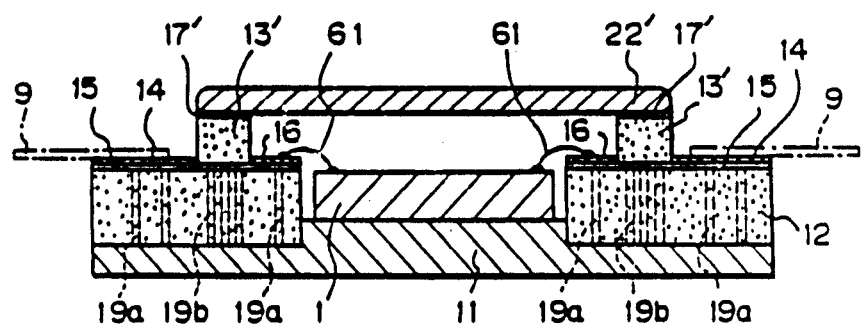
FIG. 10B is a cross sectional view of FIG. 10A.

FIGS. 10A and 10B show still another embodiment of the present invention. In FIGS. 10A and 10B, the second dielectric alumina frame 13' is used as a spacer.

The alumina frame 13' has, therefore, no conductive film 17 (FIG. 1) thereon. Accordingly, no conductor poles 19b (FIG. 1) are provided in the alumina frame 13'. The IC package is sealed with the cap 22' which is not electrically conductive and which is secured to the spacer 13' by means of a proper adhesive 17' which is electrically insulative.

The construction other than the foregoing, in the embodiment shown in FIGS. 10A and 10B is similar to that of the first embodiment shown in FIG. 1. The elements in the embodiment shown in FIGS. 10A and 10B corresponding to those in the first embodiment are designated with the same references as those in the first embodiment. A detailed explanation is, therefore, unnecessary for the other construction of the embodiment shown in FIGS. 10A and 10B.

Figure 11:
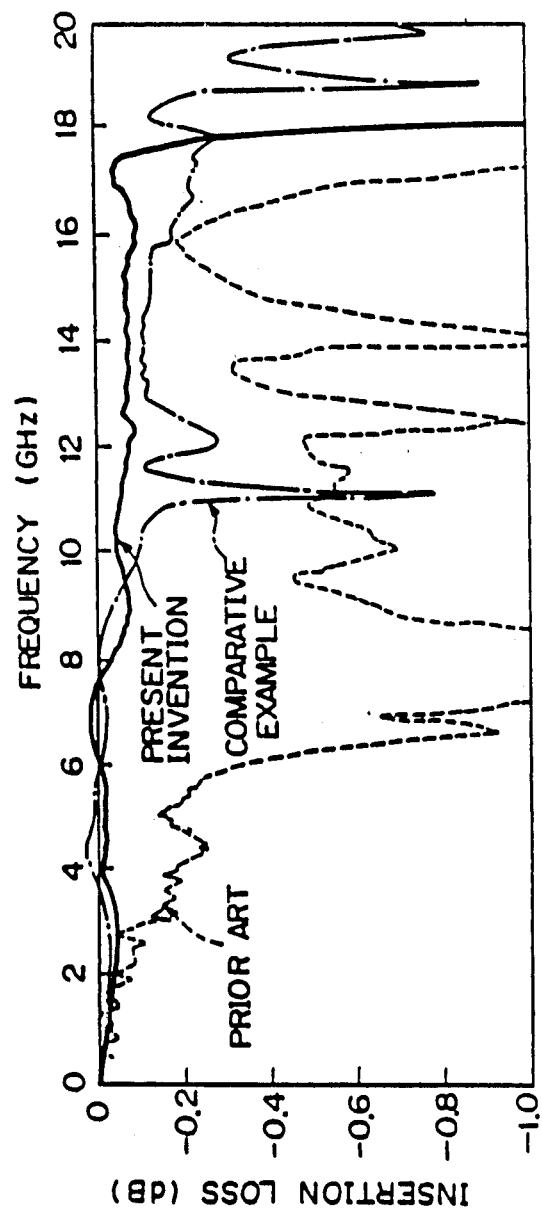
FIG. 11 is a diagram showing experimental results for proving an improved impedance regularity realized according to the present invention, in comparison with the prior art.

FIG. 11 shows experimental results showing the insertion loss in relation to the frequency. In the experiments, a flat IC package having fourteen terminals was used.

It has been found that, according to the present invention (solid line), the insertion loss was constantly below 0.2 dB when the frequency is smaller than 18 GHz and the cutoff frequency was about 18 GHz, which is relatively high. According to the prior art (dotted line) in which no conductor poles are provided between the conductor patterns, the insertion loss showed dips and the cutoff frequency was about 7 GHz, which is relatively small. It appears that this small cutoff frequency occurs mainly because of a parasitic resonance of the sealing conductor provided on the second alumina frame. No parasitic resonance was observed in the present invention.

Figure 12:
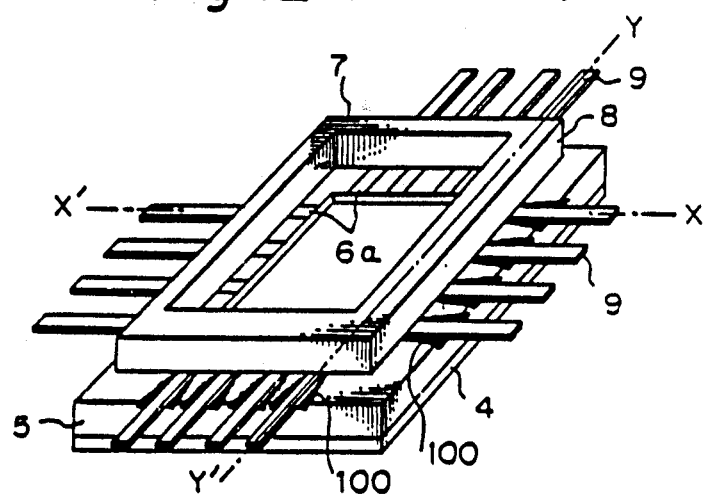
FIG. 12 is a perspective view of a known IC package according to the prior art.

The dotted and solid lines in FIG. 11 show a comparative example of an IC package which has conductor poles between the conductor patterns similar to the present invention but the impedance matching was not improved. Namely, in this comparative example, which is not prior art, the silver solder for connecting the terminals (leads) to the conductor patterns of the IC package was as shown in FIG. 12.

Therefore, the comparative example proved that the improvement of the solder or brazing connection shown in FIG. 6 contributes to a further increase of the cutoff frequency and a further decrease of the insertion loss.

As can be understood from the above discussion, according to the present invention, since the conductor poles are provided between the conductor patterns of the IC package so as to extend through the dielectric substrate (alumina frame) on which the conductor patterns are provided, the possibility of reflection of the signals can be decreased and cross talk between the adjacent conductor patterns also can be decreased, resulting in a prevention of misoperation of the IC. In addition to the foregoing, according to the present invention, an easier impedance matching can be realized. The IC package of the present invention needs only an additional process for the formation of the through holes which are filled with the conductor poles and which can be made at one time, and accordingly, the IC packages of the present invention can be easily and inexpensively manufactured.

Note that although the conductor poles and, accordingly, the through holes, are circular in cross section in the illustrated embodiments, the shape thereof is not limited to a circle and can be rectangular, square, elliptical or the like.

Finally, the present invention can be advantageously applied to a high speed logic circuit as mentioned above, as well as a linear element or amplifying circuit or the like.

What is claimed is:

1. A package for an integrated circuit having conductor lines which can be connected to an external circuit to connect the integrated circuit to the external circuit, comprising:

a dielectric plate having a first end face with a grounding conductor thereon and a second end face opposite the first end face, with the conductor lines thereon, said dielectric plate having conductor poles which are located between the conductor lines and which extend through the thickness of said dielectric plate to said grounding conductor, at least two of said conductor poles positioned intermittently between adjacent ones of the conductor lines, said at least two of said conductor poles defining a line which extends in substantially the same direction as said conductor lines.

2. An IC package according to claim 1, wherein said grounding conductor comprises a metal plate on which said dielectric plate and the integrated circuit are located.

3. An IC package according to claim 1, wherein said dielectric plate comprises a hollow frame.

4. An IC package according to claim 2, further comprising lead wires for electrically connecting the conductor lines to the integrated circuit.

5. An IC package according to claim 1, further comprising a resin mold for directly enclosing the integrated circuit.

6. An IC package according to claim 1, further comprising:

a spacer secured to said dielectric plate to surround the integrated circuit; and a cap secured to said spacer to seal said spacer.

7. An IC package according to claim 6, wherein said spacer is electrically insulative.

8. An IC package according to claim 1, wherein said dielectric plate has through holes in which said conductor poles are buried.

9. An IC package according to claim 8, wherein said conductor poles are regularly arranged between the adjacent conductor lines.

10. An IC package according to claim 1, further comprising:

leads connected to the conductor lines provided on said dielectric plate; and a predetermined pattern of brazing having a width that is the same as that of the corresponding leads for connecting said leads to the conductor lines.

11. A package for an integrated circuit having conductor lines which can be connected to an external circuit to connect the integrated circuit to the external circuit, comprising:

a first dielectric plate having a first end face with a grounding conductor thereon, and a second end face opposite the first end face, with the conductor lines thereon, said first dielectric plate having first conductor poles which are located between the conductor lines and which extend through the thickness of said first dielectric plate to said grounding conductor, at least two of said conductor poles positioned intermittently between adjacent ones of the conductor lines, said at least two of said conductor poles defining a line which extends in substantially the same direction as said conductor lines; and a second dielectric plate positioned on the conductor lines of said first dielectric plate and having a second conductor pole which is electrically connected at least partially to one of said first conductor poles of said first dielectric plate.

12. A package for an integrated circuit having conductor lines which can be connected to an external circuit to connect the integrated circuit to the external circuit, comprising:

a first dielectric plate having a first end face with a grounding conductor thereon, and a second end face opposite the first end face, with the conductor lines thereon, said first dielectric plate having first conductor poles which are located between the conductor lines and which extend through the thickness of said first dielectric plate to said grounding conductor, at least two of said conductor poles positioned intermittently between adjacent ones of the conductor lines, said at least two of said conductor poles defining a line which extends in substantially the same direction as said conductor lines; and a second dielectric plate positioned on the conductor lines of said first dielectric plate and having an end face spaced from said first dielectric plate, with a conductive film thereon, said second dielectric plate having a second conductor pole which is connected to said conductive film and which is electrically connected at least partially to one of said first conductor poles of said first dielectric plate.

13. An IC package according to claim 12, further comprising a conductive cap secured and electrically connected to said conductive film provided on said second dielectric plate to enclose the integrated circuit.

14. An IC package according to claim 13, wherein said second conductor pole in said second dielectric plate coaxially extends through said first and second dielectric plates.

15. An IC package according to claim 14, wherein said second conductor pole formed in said second dielectric plate is in alignment with the corresponding one of the first conductor poles formed in said first dielectric plate so as to establish an electrical connection therebetween.

16. An IC package according to claim 12, wherein first conductor poles are regularly arranged between the adjacent conductor lines formed in said first dielectric plate.

17. An IC package according to claim 12, wherein said grounding conductor comprises a metal plate on which said first dielectric plate and the integrated circuit are located.

18. An IC package according to claim 12, wherein said first and second dielectric plates comprise hollow frames.

19. An IC package according to claim 17, further comprising lead wires for electrically connecting the conductor lines to the integrated circuit.

20. An IC package according to claim 12, wherein said first and second dielectric plates have through holes in which said first and second conductor poles are buried.

21. An IC package according to claim 12, further comprising additional conductor patterns for connecting the conductor patterns along the conductor patterns provided on the first dielectric plate.

22. An IC package according to claim 12, further comprising:
   leads connected to the conductor lines provided on said first dielectric plate; and
   predetermined patterns of brazing having widths which are the same as that of the corresponding leads, for connecting said leads to the conductor lines.

23. A package for an integrated circuit, comprising:
   a grounding metal base;
   a first dielectric frame on said metal base and having an end face facing away from said metal base;
   conductor lines on said end face of said first dielectric frame, said conductor lines having a plurality of bar-like patterns located side by side, said first dielectric frame having through holes between adjacent ones of said conductor lines;
   first conductor poles buried in the through holes, at least two of said conductor poles positioned intermittently between adjacent ones of the conductor lines, said at least two of said conductor poles defining a line which extends in substantially the same direction as said conductor lines;
   a second dielectric frame on said conductor lines of said first dielectric frame and having an end face away from said first dielectric frame;
   a conductive film on said end face of said second dielectric frame, said conductive film being made molten by heating, said second dielectric frame having a through hole corresponding to one of the through holes of said first dielectric frame;
   a second conductor pole in the through hole of said second dielectric frame, said second conductor pole being electrically connected to one of said first conductor poles provided in said first dielectric frame; and
   a conductive cap connected to said conductive film provided on said second dielectric frame, said conductive cap being electrically connected to said grounding base through said first and second conductor poles provided in said first and second dielectric frames, respectively.

24. A package for an integrated circuit which can be connected to an external circuit to connect the integrated circuit to the external circuit, comprising:
   a grounding conductor;
   a dielectric frame having a first face on said grounding conductor and having a second face;
   conductor lines on the second face of said dielectric frame, said conductor lines for coupling the integrated circuit and the external circuit; and
   conductor poles positioned in said dielectric frame adjacent predetermined ones of said conductor patterns, said conductor poles extending through the thickness of said dielectric frame to said grounding conductor, at least two of said conductor poles positioned intermittently between adjacent tones of the conductor lines, said at least two of said conductor poles defining a line which extends in substantially the same direction as said conductor lines.

* * * * *

UNITED STATES PATENT AND TRADEMARK OFFICE
CERTIFICATE OF CORRECTION

PATENT NO. : 4,881,116

DATED : NOVEMBER 14, 1989

INVENTOR(S) : NORIO HIDADA ET AL.

It is certified that error appears in the above-identified patent and that said Letters Patent is hereby corrected as shown below:

On the title page:

[75] Inventors: "Norio Hidada" should be --Norio Hidaka--;

[56] References Cited: U.S. PATENT DOCUMENTS
Line 1, "4,262,889" should be --4,626,889--;

FOREIGN PATENT DOCUMENTS

Line 2, "0054661" should be --58-0054661--;

OTHER PUBLICATIONS

Line 7, "Gas" should be --GaAs--.

Col. 9, line 45, "space" should be --spacer--.

Col. 10, line 58, after "wherein" insert --said--.

Col. 12, line 35, "tones" should be --ones--.

Signed and Sealed this

Twenty-first Day of January, 1992

Attest:

HARRY F. MANBECK, JR.

*Attesting Officer*     *Commissioner of Patents and Trademarks*